United States Patent [19]

Kuo

[11] Patent Number: 4,613,889

[45] Date of Patent: * Sep. 23, 1986

[54] RANDOM ACCESS MOS/MEMORY CELL WITH CAPACITOR AND TRANSISTOR FORMED IN RECESS

[75] Inventor: Chang-Kiang Kuo, Houston, Tex.

[73] Assignee: Texas Instruments Incorporated, Dallas, Tex.

[*] Notice: The portion of the term of this patent subsequent to Sep. 30, 1997 has been disclaimed.

[21] Appl. No.: 640,722

[22] Filed: Aug. 14, 1984

Related U.S. Application Data

[63] Continuation of Ser. No. 192,388, Sep. 30, 1980, Pat. No. 4,467,450, which is a continuation of Ser. No. 803,495, Jun. 6, 1977, Pat. No. 4,225,945, which is a continuation-in-part of Ser. No. 648,594, Jan. 12, 1976, abandoned, and Ser. No. 722,841, Sep. 13, 1976, Pat. No. 4,240,092.

[51] Int. Cl.[4] .................. H01L 29/78; G11C 11/34
[52] U.S. Cl. .................. 357/54; 357/23.6; 357/55; 365/182
[58] Field of Search .................. 357/23.6, 55, 41, 51, 357/54; 365/149, 182, 186

[56] References Cited

U.S. PATENT DOCUMENTS 4,199,772  4/1980  Natori .................. 357/23.6

Primary Examiner—Andrew S. James
Assistant Examiner—Mark Prenty
Attorney, Agent, or Firm—John G. Graham

[57] ABSTRACT

A cell design for an MOS random access memory is disclosed. Two levels of polycrystalline silicon are used, one for the bias voltage side of the storage capacitors and another for the gates of the MOS transistors and as the bit select line or to connect the gates to the bit select line. The bit select or X address line may overlie both the first and/or second level poly, so space is saved in the cell layout. A "V-groove" anisotropically etched storage capacitor may include the MOS access transistor in one end, formed by double implant.

18 Claims, 4 Drawing Figures

RANDOM ACCESS MOS/MEMORY CELL WITH CAPACITOR AND TRANSISTOR FORMED IN RECESS

This application is a continuation of my application Ser. No. 192,388, filed Sept. 30, 1980 (now U.S. Pat. No. 4,467,450), which was a continuation of Ser. No. 803,495, filed June 6, 1977 and now U.S. Pat. No. 4,225,945, (now U.S. Pat. No. 4,240,092) which was a continuation-in-part of my earlier filed copending applications Ser. No. 648,594, filed Jan. 12, 1976 now abandoned, and Ser. No. 722,841, filed Sept. 13, 1976 and now U.S. Pat. No. 4,240,092.

BACKGROUND OF THE INVENTION

This invention relates to semiconductor memory devices and methods of manufacture thereof, and more particularly to an N-channel silicon gate MOS RAM cell.

Semiconductor memory cells of the one-transistor type are widely used in N-channel silicon gate MOS RAM's as described in U.S. Pat. No. 3,909,631, issued Sept. 30, 1975 to N. Kitagawa, and pending applications Ser. No. 648,594, filed May 3, 1976 by Kitagawa and McAlexander and now abandoned; and Ser. No. 691,735 filed June 1, 1976 by White, McAdams and Redwine and now U.S. Pat. No. 4,081,701, all assigned to Texas Instruments as well as in Electronics, Sept. 13, 1973 at pp. 116–121, Feb. 19, 1976 at pp. 116–121, and May 13, 1976 at pp. 81–86. The most widely manufactured device of this type contains 4096 or $2^{12}$ bits, referred to in the industry as a "4K RAM", or more recently the 16X RAM with 16384 bits is coming into production. It is expected that 64K and 256K devices will be introduced. The costs in the production of semiconductor devices are such that most of the expense is in bonding, packaging, testing, handling, and the like, rather than the cost of producing the actual circuitry in the small chip of silicon. Thus, any circuit which can be contained within a chip of a given size, for example, 30,000 square mils, will cost about the same as any other. By forming "16K" or 16384 ($2^{14}$) memory cells or bits in a chip, large economies in the cost per bit can result compared to a device containing 4K bits, if reasonable yields are obtained. As the size of a chip increases, the yield decreases, so that at sizes above about 180 mils on a side the advantages are outweighed by reduction in yield. Accordingly, it is desirable to reduce the area occupied by each bit or cell in a RAM. Using photolithographic processes with ultraviolet light and glass masks as is now standard, cell sizes of about one square mil or slightly less are obtained. To produce 64K and 256K RAM's, cell sizes of perhaps 0.2 or 0.3 square mil per bit must be obtained.

One-transistor cells in MOS integrated circuits employ storage capacitors of the type having a silicon oxide dielectric as set forth in U.S. Pat. No. 3,350,760, issued Nov. 7, 1967, to Jack S. Kilby, assigned to Texas Instruments. These may be of the so-called gated type, i.e., voltage dependent, and may have ion implanted regions thereunder as set forth in copending applications Ser. No. 645,171, filed Dec. 29, 1975 by Gerald D. Rogers, now abandoned or Ser. No. 722,841, filed Sept. 13, 1976 by C-K Kuo, both assigned to Texas Instruments.

The magnitude of the storage capacitor in a one-transistor cell should be large so that the time between refresh cycles is long, and also so that a good signal is produced in the bit line when a cell is accessed. Large arrays such as $128 \times 128$ or $256 \times 256$ mean that the bit lines are long and have high capacitance, reducing the ratio of storage capacitance to bit line capacitance, thus tending to reduce the signal. Also, large arrays dictate small cell area, thus small capacitors. The capacitance can be increased by reducing the oxide dielectric thickness, but this is detrimental to yield. In a dynamic RAM using one-transistor cells, the reliability of the storage capacitor is critical, since the capacitors constitute a major portion of the total thin oxide area of the chip. Generally, reliability and yield of a device are both inversely related to the area of the chip occupied by thin oxide. The capacitor dielectric areas are more critical than the gate areas of the transistors because they are larger and can be under a high electric field stress. Life test data on N-channel MOS dynamic RAM devices shows that 80 to 90% of reliability related failures are due to oxide defects in the storage capacitors. By increasing the capacitor area, the electric field intensity in the storage capacitor dielectric for a given charge stored can be reduced so the reliability is increased. Alternatively, by reducing the field intensity, the oxide can be made thinner for a yield so that the capacitance per unit area may be increased, allowng a reduction in overall thin oxide area.

Increase in capacitance value for a given cell area is accomplished by an anisotropically-etched V-groove as disclosed in copending applications Ser. No. 763,780, filed Jan. 31, 1977 by G. R. Mohan Rao et al, and now abandoned, and Ser. No. 765,181, filed Feb. 3, 1977 by G. R. Mohan Rao and C-K Kuo, and now abandoned, both assigned to Texas Instruments. The V-groove is also useful in creating a very short channel MOS transistor with accurately controlled threshold voltage by a double ion implant process with anisotropic etch as disclosed in IEEE Journal of Solid State Circuits, February 1977, pp. 3–10.

The principal object of this invention is to provide an improved transistor and storage capacitance combination for a random access memory cell, particularly a very small area cell. Another object is to provide an improved method of making N-channel silicon gate RAM devices. A further object is to provide an MOS RAM cell of smaller size made by a process compatible with existing N-channel silicon gate manufacturing methods.

SUMMARY OF THE INVENTION

According to the invention, an N-channel silicon gate MOS memory cell is provided which uses two levels of polycrystalline silicon. The first level provides the upper plate of the storage capacitors for the cells in a column. This level is connected to a bias voltage supply or Vss and is common to all cells in a column. The second level in part overlies the first and provides the gates of the MOS transistors, and also the X address line or a connection from the gates to an overlying metal strip which is the X address line. One end of the source-to-drain path of the transistor is created by an edge of the inverted region beneath the first level poly, i.e., one side of the capacitor region. This capacitor region may be implanted to lower the voltage needed to invert it.

According to one embodiment of the invention, an improved storage capacitor for the N-channel silicon gate MOS memory cell is provided which uses an anisotropically etched V-shaped depression in the region to increase the effective area of the storage capacitor, and this V-groove also creates the MOS transistor. Above the V-groove, the first level polycrystalline silicon strip, isolated from the surface by a dielectric provides the upper plate of the storage capacitors for all cells in a column, and the area beneath this strip may be ion implanted region to lower the voltage needed to invert this area; this strip is connected to a low voltage bias voltage supply or to ground. An area of the second level polycrystalline silicon also provides the gate of an MOS transistor which functions as the access device and the second level poly provides the X address line; the first and second levels are separated from one another by a thin dielectric.

THE DRAWINGS

The novel features believed characteristic of the invention are set forth in the appended claims. The invention itself, however, as well as other features and advantages thereof, is best understood from the following detailed description of particular embodiments, when read in conjunction with the accompanying drawings, wherein:

FIGS. 4a through 12b, inclusive, of my U.S. Pat. No. 4,225,945, incorporated herein by reference, show other embodiments of the invention and methods of making.

Figure 1:
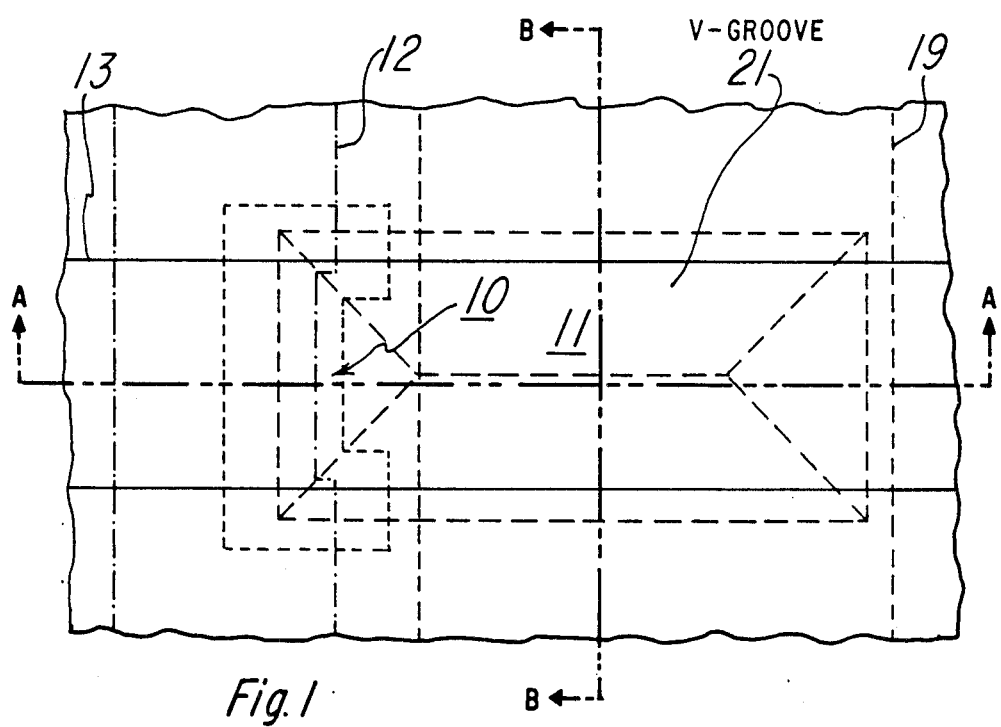
FIG. 1 is a greatly enlarged plan view of a very small area on a semiconductor chip, showing a random access memory cell made according to the invention.
Figure 2:
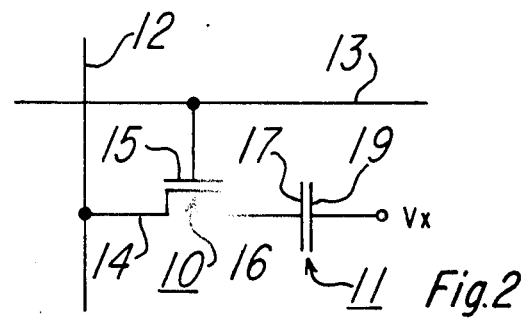
FIG. 2 is an electrical schematic diagram of the cells of FIG. 1.

Referring now to FIG. 1, an N-channel MOS RAM cell is shown in plan view according to one embodiment of the invention. This cell would be in an array of perhaps 64K or 65536 like cells on a chip of silicon less than 200 mils on a side. The cell includes a transistor 10 and storage capacitor 11, also seen in the schematic diagram of FIG. 2. A sense or bit line 12 is provided by an elongated N+ implanted region which is a "Y select" line to which one hundred twenty-eight or two hundred fifty-six like cells are connected. A 64K array, would include 256 Y lines and 256 X lines. The X line is a second-level polycrystalline silicon row select line 13 which will form the gates of the transistor 10 for all cells in a row of 256.

Figure 3A:
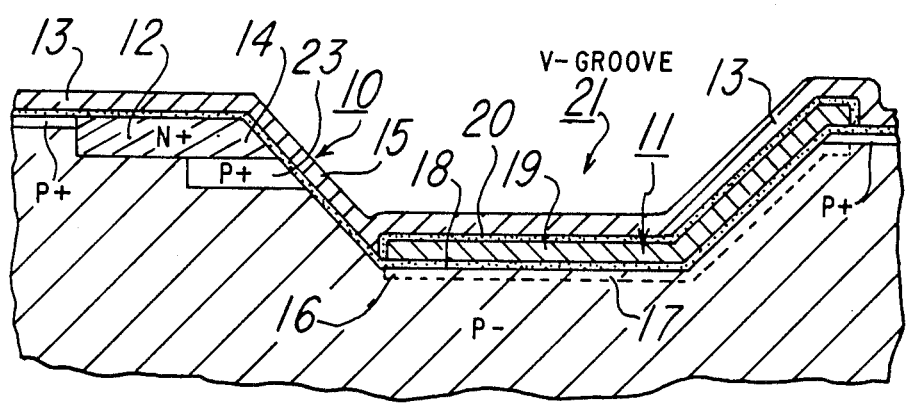
FIGS. 3a and 3b are sectional views (FIG. 3a being in perspective) of the device of FIG. 1, taken along the lines a—a and b—b of FIG. 1, respectively.
Figure 3B:
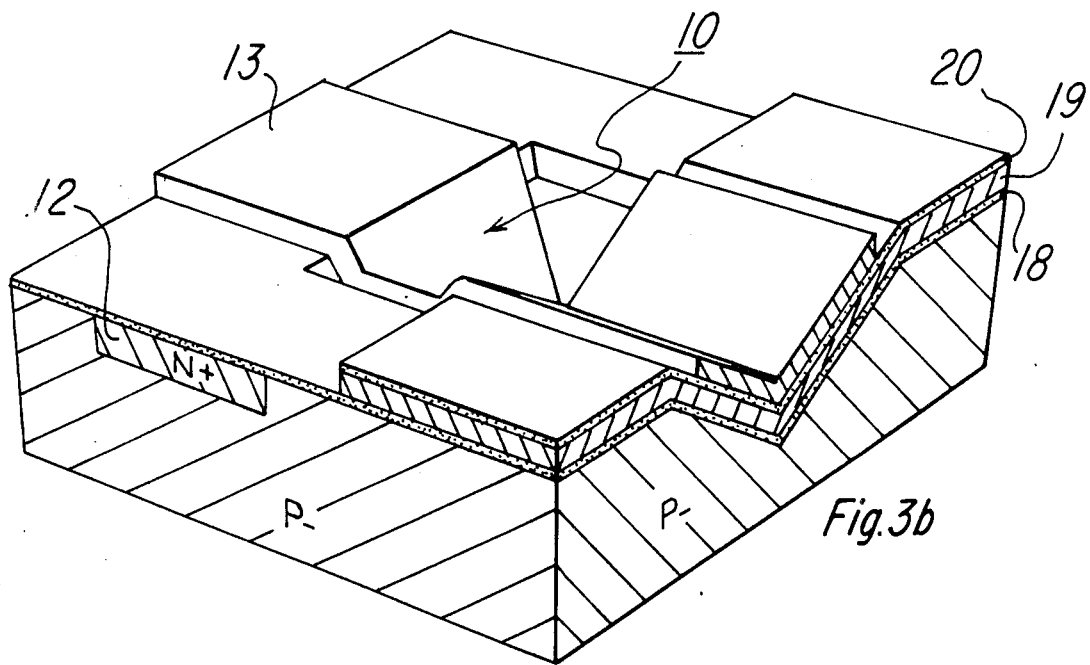

As best seen in FIGS. 3a and 3b along with FIG. 1, each MOS transistor 10 includes an N+ implanted region 14 which is part of the sense line 12, along with a gate 15 created by the second level poly line 13. The drain (or the other end of the source-to-drain path) of the MOS transistor is created in a region 16 which is the left-hand (in FIGS. 1 and 3a) edge of an inversion region 17 beneath the capacitor 11. The region 17 is the lower plate of the capacitor. A thin silicon oxide layer 18 functions as both the gate insulator for the MOS transistor 10 and the dielectric of the capacitor 11. The upper plate of the capacitor is provided by a first-level polycrystalline silicon strip 19 which is connected to a reference potential; preferably, the region 17 inverts with a low voltage or Vss on the line 19, and to accomplish this the doping level of the starting material is low. A layer 20 of silicon oxide separates the first and second levels of polysilicon. No metal level is needed in the array, and no contacts, poly-to-silicon or poly-to-poly, are needed, although a metal level and contacts would be used in the peripheral circuitry.

An important feature of this embodiment is a V-groove 21 which is formed in the face of the silicon body by anisotropic etching as explained in copending application Ser. No. 763,780, filed Jan. 31, 1977, by G. R. Mohan Rao et al, assigned to Texas Instruments. The <100> crystalline face of a silicon slice, masked with oxide, etches to expose the <111> planes 22 which are at an angle of 54.7 with respect to the original <100> plane. The etch process usually employs hydrazine; it is terminated before the bottom of the V-groove reaches an apex so that a flat bottom is provided. The V-groove functions not only to increase the capacitance value for a given area on the slice, but also to define a channel 23 for the MOS transistor 10. The channel 23 is part of a P+ type implanted region 24; by controlling the implant depth, the channel length can be reliably established at very short distances (for example, 0.1 to 0.5 $\mu$m). Conventional MOS transistors of the type described in the above mentioned Sept. 13, 1973 Electronics article have minimum channel lengths of perhaps 5 $\mu$m. The additional capacitance as a result of the increase area of the side walls of the V-groove is about 70% over what the capacitance would be with a flat surface.

A method of making the cell of FIG. 1 is described with reference to FIGS. 4a-4d of my U.S. Pat. No. 4,225,945, incorporated herein by reference.

Other embodiments of the invention, and methods of making, are set forth in my U.S. Pat. No. 4,225,945, incorporated herein by reference.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. An N-channel memory cell formed at a face of a silicon body and having an insulated-gate transistor means and capacitance means, the transistor means including a gate composed of conductive material and including a source-to-drain path formed in the silicon of said face, a heavily doped N+ region as one end of the source-to-drain path in said face, the capacitance means including a plate composed of conductive material and including a capacitor region in the silicon of said face spaced from said plate by a thin dielectric, the improvement comprising:

an anisotropically-etched recess extending into said face of the silicon body, the capacitor region being defined within the recess, and the source-to-drain path of the transistor means being defined in at least one sidewall of the recess, the gate being within the recess and spaced from the capacitance means.

2. A memory cell according to claim 1, wherein the conductive means is defined by polycrystalline silicon.

3. A memory cell according to claim 2, wherein the cell is characterized by the absence of metal-to-polysilicon contacts.

4. A memory cell according to claim 3 wherein the capacitor region is implanted region having a low threshold voltage.

5. A memory cell according to claim 4, wherein the capacitor region is an inverted region of the original silicon body and a voltage of near zero volts is applied to said plate.

6. A semiconductor memory cell having an insulated gate field effect transistor and a capacitor, comprising:
a semiconductor body having a major face, a recess extending into said face,
the capacitor being formed in the recess by an upper plate and a lower plate, the upper plate including a conductive layer separated from the lower plate by a dielectric, the lower plate including a region of the semiconductor material in the recess,
the transistor being formed in the recess by a heavily-doped drain region of one conductivity type and a channel region of the other type exposed at at least one sidewall of the recess, along with a gate within the recess separated from the channel region by a gate insulator.

7. A memory cell according to claim 6 wherein the conductive layer and the gate are both polycrystalline silicon.

8. A memory cell according to claim 7 wherein two levels of polycrystalline silicon are provided, one overlying the other.

9. A memory cell according to claim 7 wherein the transistor has a source-to-drain path, one end of which is the heavily-doped region of one conductivity type and the other end of which engages an edge of the capacitor region in the recess.

10. A memory cell according to claim 7 wherein the semiconductor material of said drain region is partly at the flat surface of said face and partly along said at least one sidewall of said recess.

11. A memory cell formed at a face of a semiconductor body and employing a recess in said face to reduce the area occupied by the memory cell on said face, the memory cell comprising:
an insulated-gate field-effect transistor having a source-to-drain path and a gate, with a gate insulator separating the source-to-drain path from the gate; at least part of said gate, said source-to-drain path, and said gate insulator being located within said recess; and
a capacitor having a semiconductor region and a conductor, with a dielectric separating the semiconductor region from the conductor; at least part of said semiconductor region, said conductor and said dielectric being located within said recess.

12. A memory cell according to claim 12 wherein said conductor is polycrystalline silicon, and a heavily-doped region in said face is at one end of said source-to-drain path.

13. A memory cell according to claim 12 wherein said gate is part of an elongated strip extending along said face to form gates for a plurality of like memory cells.

14. A memory cell according to claim 14 wherein said drain region is part of an elongated region extending along said face to form a bit line and connect to drains for a plurality of like memory cells.

15. A memory cell according to claim 12 wherein said conductor is coupled to a potential of about ground, and said semiconductor region is doped to exhibit a threshold of about zero.

16. A memory cell according to claim 12 wherein at least part of said semiconductor region, said conductor and said dielectric is located deeper in said recess than said gate.

17. A memory cell according to claim 17 wherein one end of said source-to-drain path is wholly within said recess and engages an edge of said semiconductor region.

18. A memory cell according to claim 18 wherein said source-to-drain path includes a channel which is wholly within said recess.

* * * * *